United States Patent
Fischer

(10) Patent No.: US 6,701,496 B1
(45) Date of Patent: Mar. 2, 2004

(54) SYNTHESIS WITH AUTOMATED PLACEMENT INFORMATION FEEDBACK

(75) Inventor: Eric Fischer, Eau Claire, WI (US)

(73) Assignee: Silicon Graphics, Inc., Mountain View, CA (US)

( * ) Notice: Subject to any disclaimer, the term of this patent is extended or adjusted under 35 U.S.C. 154(b) by 189 days.

(21) Appl. No.: 09/620,338

(22) Filed: Jul. 20, 2000

(51) Int. Cl.$^7$ ............................................... G06F 17/50
(52) U.S. Cl. ...................... 716/6; 716/5; 716/8; 716/18
(58) Field of Search .......................... 716/6, 4, 5, 7–14, 716/2, 3, 18

(56) References Cited

U.S. PATENT DOCUMENTS

| | | | | |
|---|---|---|---|---|
| 4,896,272 A | | 1/1990 | Kurosawa .................... 364/491 |
| 5,521,836 A | | 5/1996 | Hartong et al. ............. 364/491 |
| 5,535,223 A | | 7/1996 | Horstmann et al. ........... 371/27 |
| 5,555,188 A | | 9/1996 | Chakradhar ................. 364/490 |
| 5,757,658 A | | 5/1998 | Rodman et al. ............. 364/491 |
| 5,787,268 A | | 7/1998 | Sugiyama et al. ........... 395/500 |
| 5,910,898 A | | 6/1999 | Johannsen ................... 364/489 |
| 6,099,580 A | * | 8/2000 | Boyle et al. ..................... 716/7 |
| 6,145,117 A | * | 11/2000 | Eng ............................. 716/18 |
| 6,295,636 B1 | * | 9/2001 | Dupenloup .................. 716/18 |
| 6,324,678 B1 | * | 11/2001 | Dangelo et al. .............. 716/18 |

* cited by examiner

Primary Examiner—Vuthe Siek
(74) Attorney, Agent, or Firm—Schwegman, Lundberg, Woessner & Kluth, P.A.

(57) ABSTRACT

A method, system, and program product for designing and verifying an electronic circuit. A circuit logic design is translated into a netlist using a synthesis tool. The synthesis tool receives inputs of placing, routing, and timing information. Timing delays in the logic design are represented in the netlist using the placing and routing information. It is determined whether a timing goal has been reached based on the timing delays. When the timing goal has not been reached, changes are made to the placing, routing, and timing information, and the synthesis tool is re-executed using the changed information until the timing goal is reached.

21 Claims, 2 Drawing Sheets

SYNTHESIS WITH AUTOMATED PLACEMENT INFORMATION FEEDBACK

CROSS REFERENCE TO RELATED APPLICATIONS

This application is related to "Optimize Global Net Timing," application Ser. No. 09/620,504, filed Jul. 20, 2000, and incorporated herein by reference.

FIELD OF THE INVENTION

The present invention relates to the field of computer aided design tools used for designing and verifying integrated circuits.

COPYRIGHT NOTICE/PERMISSION

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever. The following notice applies to the software and data as described below and in the drawings hereto: Copyright © Silicon Graphics, Incorporated, 2000. All Rights Reserved.

BACKGROUND OF THE INVENTION

Electrical engineers use computer aided design (CAD) tools to design integrated circuits. The integrated circuit design process includes constructing the integrated circuit design out of simple circuits (e.g., "standard cells") that are electrically connected together using wire interconnects. The CAD tool stores the standard cells and connections between them in well-known databases called "netlists." A chip manufacturing foundry uses the netlist as input to build the physical integrated circuit.

As part of the design process, the CAD tool "places" and "routes" design information within a netlist using placing and routing processes (also called placers and routers) that are typically software programs executed by the CAD tool. The placer determines the optimum location of each standard cell within the integrated circuit layout on the semiconductor surface. The placer optimizes the placement location to reduce the distance between standard cells that are electrically connected to each other by wire interconnects (e.g., input/output lines). This is done to both (1) minimize the semiconductor area consumed by the integrated circuit; and (2) minimize the lengths of wire interconnects to reduce net capacitance within the design. The router optimizes the routing of input/output lines between connected standard cells, so that areas of the integrated circuit layout do not become overly congested by input/output lines.

After the engineer has used the CAD tool to design the logic of the integrated circuit, the engineer would like to verify that the circuit design operates as intended prior to actually building the physical chip that embodies the logic design. To accomplish this verification, the engineer typically uses logic simulation and timing verification tools, which test the design and verify that the timing of operations will fit within a clock cycle. If the timing of an operation does not fit within a clock cycle, timing is said to have failed, and the engineer must redesign the logic.

Thus, the engineer must run a variety of independent logic design, testing, and timing verification programs and manually use the output of the testing and timing verification programs to redesign the logic. This manual process is time consuming and cumbersome. Thus, there is a need for an automatic process for connecting the various design, testing, and timing verification programs together and analyzing timing results and using those results to redesign the circuit logic.

SUMMARY OF THE INVENTION

The present invention provides solutions to the above-described shortcomings in conventional approaches, as well as other advantages apparent from the description below.

The present invention provides a method, system, and program product for designing and verifying an electronic circuit. In one aspect, a circuit logic design is translated into a netlist using a synthesis tool. The synthesis tool receives inputs of placing, routing, and timing information. Timing delays in the logic design are represented in the netlist using the placing and routing information. It is determined whether a timing goal has been reached based on the timing delays. When the timing goal has not been reached, changes to the placing, routing, and timing information are made, and the synthesis tool is re-executed using the changed information until the timing goal is reached.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention, but other embodiments may be utilized, and logical, mechanical, electrical, and other changes may be made to the embodiments without departing from the scope of the present invention. The following detailed description is, therefore, not to be taken in a limiting sense, and the scope of the present invention is defined only by the appended claims.

Figure 1:
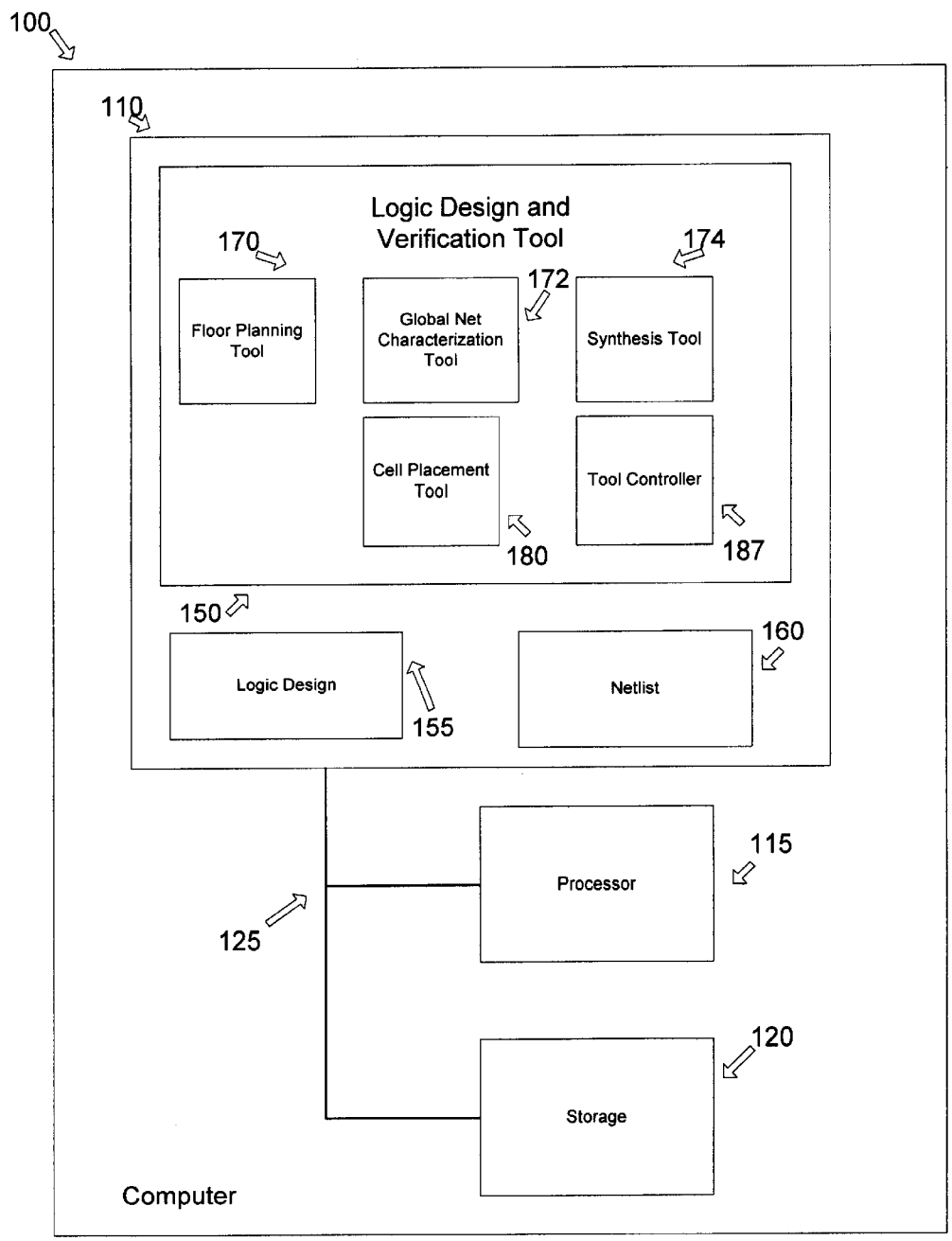
FIG. 1 depicts a block diagram of an example computer system that can be used to implement an embodiment of the invention.

FIG. 1 depicts a block diagram of an example computer system that can be used to implement an embodiment of the invention. Computer 100 contains memory 110, processor 115, and storage 120 connected via bus 125.

Memory 110 comprises a number of individual, volatile-memory modules that store segments of operating system and application software while power is supplied to computer 100. The software segments are partitioned into one or more virtual memory pages that each contain a uniform number of virtual memory addresses. When the execution of software requires more pages of virtual memory than can be stored within memory 110, pages that are not currently needed are swapped with the required pages, which are stored within non-volatile storage device 120. Memory 110 is a type of memory designed such that the location of data stored in it is independent of the content. Also, any location in memory 110 can be accessed directly without needing to start from the beginning.

Memory 110 contains Logic Design and Verification Tool 150, logic design 155, and netlist 160. Tool 150 contains instructions capable of being executed by processor 115. In the alternative, tool 150 could be implemented by control circuitry through the use of logic gates, programmable logic devices, or other hardware components in lieu of a processor-based system.

Tool 150 contains floor planning tool 170, global net characterization tool 172, synthesis tool 174, cell placement tool 180, and tool controller 187. The operation of tool 150 is further described below under the description for FIG. 2.

Logic design 155 is an input file that tool 150 will read and process, as further described below under the description for FIG. 2. Referring again to FIG. 1, logic design 155 is created by an engineer and contains (1) an estimation of cell counts within each floor plan block; (2) floor plan documentation; (3) core level blocks stitched together (single fanout nets); (4) I/O types and C4 connections; and (5) decoupling capacitors.

Netlist 160 is the output of tool 150 and describes the format of an integrated circuit. A chip manufacturing foundry uses netlist 160 as input to build the physical integrated circuit.

Processor 115 includes the portion of computer 100 that controls the operation of the entire computer system, including executing the arithmetical and logical functions contained in a particular computer program. Although not depicted in FIG. 1, processor 115 typically includes a control unit that organizes data and program storage in a computer memory and transfers the data and other information between the various parts of the computer system. Processor 115 also generally includes an arithmetic unit that executes arithmetical and logical operations, such as addition, comparison, and multiplication. Processor 115 accesses data and instructions from and stores data to volatile memory 110. Although computer 100 is shown to contain only a single processor 115 and a single bus 125, the present invention applies equally to computer systems that have multiple processors and to computer systems that have multiple buses that each perform different functions in different ways.

Non-volatile storage 120 could be any type of storage device, such as a diskette drive, a hard-disk drive, a tape drive, or a CD-ROM drive. Although storage 120 is shown as being incorporated within computer 100, it could be external to computer 100, either connected directly or on a local area network, on an external network, or attached to a remote computer system.

Computer 100 can be implemented utilizing any suitable computer such as an IBM-compatible personal computer available from a variety of vendors. But, the present invention can apply to any hardware configuration that allows circuit design and verification, regardless of whether the computer system is a complicated, multi-user computing apparatus, a single-user work station, a hand-held device, or a network appliance that does not have non-volatile storage of its own.

As will be described in detail below, aspects of an embodiment of the invention pertain to specific method steps implementable on a computer system. In another embodiment, the invention may be implemented as a computer program product for use with a computer system. The programs defining the functions of the embodiment can be delivered to a computer via a variety of signal-bearing media, which include, but are not limited to, (1) information permanently stored on nonwriteable storage media (e.g., read-only memory devices such as CD-ROM disks); (2) alterable information stored on writeable storage media (e.g., floppy disks within a diskette drive, tapes within a tape drive, or a disk within a hard-disk drive); or (3) information conveyed to a computer by a communications media, such as through a computer or telephone network, including wireless communications. Such signal-bearing media when carrying computer-readable instructions that direct the functions of the present invention represent embodiments of the present invention.

Figure 2:
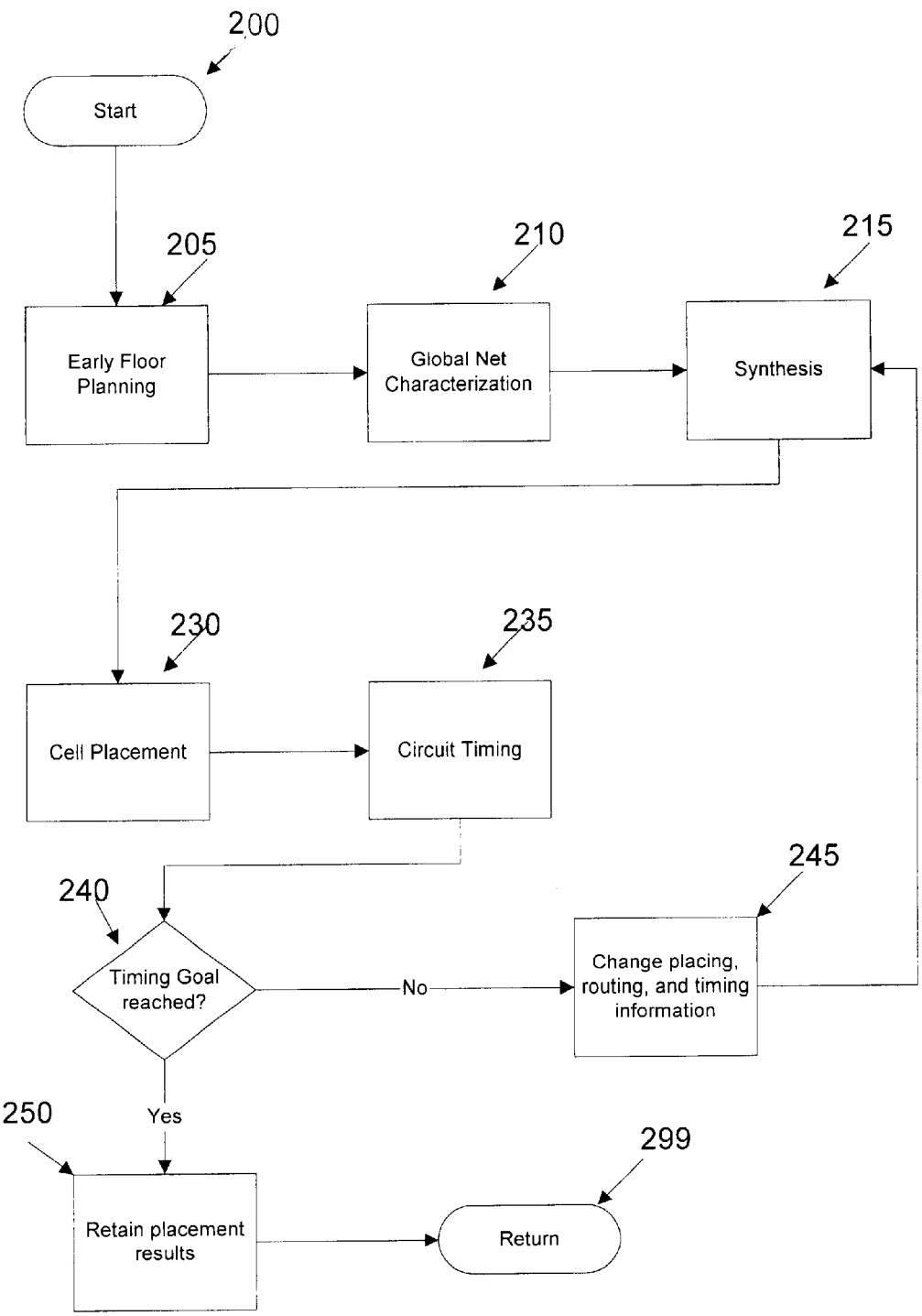
FIG. 2 depicts a flowchart that describes the operation of an embodiment of the invention.

FIG. 2 depicts a flowchart that describes the operation of an embodiment. At block 200, control begins. Control then continues to block 205 where early floor planning occurs using floor planning tool 170. In one embodiment, the HDP floor planning tool available from IBM is used, although any suitable floor planning tool could be used. The logic designer submits logic design 155 to floor planning tool 170. Logic design 155 contains (1) estimation of cell counts within each floor plan block; (2) floor plan documentation; (3) core level blocks stitched together (single fanout nets); (4) I/O types and C4 connections; and (5) decoupling capacitors. With this information as input, floor planning tool 170 builds the top level of the hierarchy. Contained in the top level are the floor plan blocks, I/O placements, and decoupling capacitors. Floor planning tool 170 places the core level blocks at the second level of the hierarchy and ungroups, or flattens, the core level. Floor planning tool 170 then calculates aspect ratios based on the logic design cell count estimations. Floor planning tool 170 places I/O or port locations of the floor plan blocks based on top-level connectivity. The floor plan is then assembled and finalized.

Control then continues to block 210 where global net characterization occurs. Tool controller 187 takes the output from floor planning tool 170 and uses it as input into global net characterization tool 172. Global nets connect each floor plan block together at the core or top level of the design. The main goal of global net characterization is to correctly identify the delay between floor plan blocks.

Global net characterization tool 172 analyzes each net by its length and applies algorithms in order to optimize the delay of the net length. The algorithms guard against slew rate violations and then optimize the speed of the net. The algorithms used by global net characterization tool 172 are determined by the logic designer based on characterization results. The optimization algorithms of global net characterization tool 172 modify the global net in order to minimize the delay of signals across the global net. Global net characterization tool 172 characterizes the global net delay on each input and output as "input delay" and "output delay." Global net characterization tool 172 analyzes each scenario in terms of area consumption and routability between and over floor plan blocks.

Finally, global net characterization tool 172 reads the output and input timing reports, converts delay into numbers, and places the results in ETA (Estimated Time of Arrival) and PIS (Primary Inputs Delay File) file format. Global net characterization tool 172 converts the SID/SOD port timing numbers previously characterized in block 205 to PIS/ETA assertion files and converts the synthesis clock definition to a phase file. Capacitive assertion (POS) is carried forward in order to control drive cell affinity to port locations. Output loading is used to draw the driving port cell (cell affinity) close to the output port.

The output of global net characterization tool 172 consists of tool-constraint files for all floor plan blocks.

Control then continues to block 215 where synthesis occurs. Tool controller 187 takes the floor plan blocks that are output from global net characterization tool 172 and uses them as input into synthesis tool 174. Synthesis takes place within the floor plan block. There can also be synthesis at sub-levels of hierarchy within the floor plan block. Global net characterization tool 172 provides customized templates to the logic designer for items such as clock rate, uncertainty, and input/output delays fro each floor plan block. These templates could be further modified by the logic designer depending on the design requirements. Synthesis tool 174 obtains real timing delay values in place of wire load modeling. After these values are obtained, synthesis tool 174 fixes real timing violations.

Synthesis tool 176 assigns physical design attributes, performs cleanup routines, writes out ASIC (Application Specific Integrated Circuit) sanity checks to an output file, and generates VIM (VLSI integrated module). Because of the inclusion of the port characterizations done in early floor planning 205, these values are contained in the input and output port timing reports.

Synthesization tool 174 produces as output a design EDIF (Electronic Design Interchange Format) file, which is an industry standard format for a netlist. But, any suitable format for the netlist could be used.

Control then continues to block 230 where cell placement occurs. Tool controller 187 transfers the output of global net characterization tool 172 to the input of cell placement tool 180. In one embodiment, the ChipBench tool available from IBM is used for cell placement tool 180, although any suitable cell placement tool could be used. Cell placement tool 180 reads the design (including the floor plan block size and port locations), reads assertions, performs cell placement with capacitive target generation (timing-driven layout), writes out VIM (contains cell placement information), and writes out RC to be used for synthesis back annotation. In the event that the interface to the RLM (Random Logic Module) was changed, VIMDEF is compared to a VIM physical and any RPIN's are removed that do not have a corresponding DPIN. A RPIN is added if a new DPIN exists. This effectively keeps all other relevant physical information intact between design iterations.

Control then continues to block 235 where circuit timing via synthesis optimization occurs. Tool controller 187 transfers the output of cell placement tool 180 to the input of synthesis tool 174. Synthesis tool 174 back annotates cell placement information into the interface of floor planning tool 170. Synthesis 174 uses knowledge of cell locations, timing information for the design, and capacitance for all nets. Synthesis tool 174 also uses techniques based on the amount of negative slack in the design.

Control then continues to block 240 where tool controller 187 determines whether the timing goal is reached. The time it takes a signal to propagate through a component, such as a logic gate, is typically referred to as the "gate delay". The delay associated with the interconnect for connecting one gate to another is typically referred to as the "interconnect delay". The combination of these two delays is typically referred to as "wire delay" or "timing." The interconnect delay depends on the resistance and capacitance of the conductive paths between gates. Further, the interconnect delay depends on driving characteristics of the gate or gates that are used to drive the interconnect. The driving characteristics of a gate include the slope of the gate output signal when the gate is transitioned from one value to another, such as from one logic state (e.g., logic level "0") to another logic state (e.g., logic level "1"), or vice versa.

The timing goal is reached when the timing of each operation carried out by the logic design will fit within one clock cycle. If the timing goal is reached, then control continues to block 250 where controller 150 retains the cell placement results in netlist 160.

If the timing goal is not reached, then control continues to block 245 where tool controller 187 makes changes to the placing, routing, and timing information. Tool controller 187 changes the placement information for all internal RLM (Random Logic Module) placed cells, the capacitance and resistance information for all internal RLM cell connections, and the timing information for all internal RLM cells.

On each successive pass through block 245, tool controller 187 makes successively smaller changes to the placing, routing, and timing information. Control then returns to block 215, as previously described above. Thus, tool controller 187 back annotates the placing, routing, and timing information to synthesis tool 174, which can now perform accurate decisions based on this information and can tune the circuits to operate within the target clock period. For example, synthesis tool 174 can adjust the drive strengths to drive real metal loads. Synthesis tool 174 can re-synthesize combinational logic to operate more efficiently within a clock period. Synthesis tool 174 can lower the drive strength to certain cells in order to reduce power consumption. Synthesis tool 174 can re-buffer or repeat large fanout trees to avoid timing and slew-related issues. Thus, using back annotation of placing, routing, and timing information, synthesis tool 174 can operate under real-world conditions otherwise not represented by a wireload model.

The above description is intended to be illustrative, and not restrictive. Although numerous characteristics and advantages of various embodiments of the present invention have been set forth in the foregoing description, together with details of the structure and function of various embodiments, many other embodiments and changes to details will be apparent to those of skill in the art upon reviewing the above description. The scope of the invention should, therefore, be determined with reference to the appended claims, along with the full scope of equivalents to which such claims are entitled.

What is claimed is:

1. A computer-implemented method of designing and verifying an electronic circuit, comprising:

a) translating a circuit logic design into a netlist using a synthesis tool, wherein the synthesis tool receives inputs of placing, routing, and timing information;

b) representing real timing delays in the netlist using the placing and routing information;

c) determining whether a timing goal has been reached based on the timing delays; and d) when the timing goal has not been reached, making changes to the placing, routing, and timing information and re-executing the translating, representing and determining elements.

2. The method of claim 1, wherein the a), b), c), and d) steps are re-executed a plurality of times, each time with smaller changes to the placing, routing, and timing information.

3. The method of claim 1, further comprising:
   performing early floor planning and passing results of the early floor planning to a global net characterization tool.

4. The method of claim 3, further comprising:
   performing global net characterization and passing results of the global net characterization to the synthesis tool.

5. The method of claim 4, further comprising:
   performing synthesis based on the results of the global net characterization; and passing the results of the synthesis to a cell placement tool.

6. The method of claim 5, further comprising:

performing cell placement based on the results of the synthesis tool; and passing results of the cell placement to the synthesis tool.

7. The method of claim 6, further comprising:

performing synthesis optimization based on the results of the cell placement, and passing results of the synthesis optimization to the determining step.

8. A signal-bearing media bearing instructions, which when executed on a computer cause the computer to perform:
   a) translating a circuit logic design into a netlist using a synthesis tool, wherein the synthesis tool receives inputs of placing, routing, and timing information;
   b) representing real timing delays in the netlist using the placing and routing information;
   c) determining whether a timing goal has been reached based on the timing delays; and
   d) when the timing goal has not been reached, making changes to the placing, routing, and timing information and re-executing the translating, representing and determining elements.

9. The signal-bearing media of claim 8, wherein the a), b), c), and d) steps are re-executed a plurality of times, each time with smaller changes to the placing, routing, and timing information.

10. The signal-bearing media of claim 8, further comprising:

performing early floor planning and passing results of the early floor planning to a global net characterization tool.

11. The signal-bearing media of claim 10, further comprising:

performing global net characterization and passing results of the global net characterization to a synthesis tool, wherein the synthesis tool performs the translating element.

12. The signal-bearing media of claim 11, further comprising:

performing synthesis based on the results of the global net characterization; and passing the results of the synthesis to a cell placement tool.

13. The signal-bearing media of claim 12, further comprising:

performing cell placement based on the results of the synthesis tool; and passing results of the cell placement to the synthesis tool.

14. The signal-bearing media of claim 13, further comprising:

performing synthesis optimization based on the results of the cell placement, and passing results of the synthesis optimization to the determining step.

15. A computer, comprising:

a processor;

memory coupled to the processor, wherein the memory contains instructions, which when executed on the processor cause the computer to perform:

translating a circuit logic design into a netlist using a synthesis tool, wherein the synthesis tool receives inputs of placing, routing, and timing information;

representing real timing delays in the netlist using the placing and routing information;

determining whether a timing goal has been reached based on the timing delays; and when the timing goal has not been reached, making changes to the placing, routing, and timing information and re-executing the translating, representing and determining elements.

16. The computer of claim 15, wherein the translating, representing, and determining elements are re-executed a plurality of times, each time with smaller changes to the placing, routing, and timing information.

17. The computer of claim 15, wherein the memory further comprises instructions causing the computer to perform:

performing early floor planning and passing results of the early floor planning to a global net characterization tool.

18. The computer of claim 17, wherein the memory further comprises instructions causing the computer to perform:

performing global net characterization and passing results of the global net characterization to a synthesis tool, wherein the synthesis tool performs the translating element.

19. The computer of claim 18, wherein the memory further comprises instructions causing the computer to perform:

performing synthesis based on the results of the global net characterization; and passing the results of the synthesis to a cell placement tool.

20. The computer of claim 19, wherein the memory further comprises instructions causing the computer to perform:

performing cell placement based on the results of the synthesis tool; and passing results of the cell placement to the synthesis tool.

21. The computer of claim 20, wherein the memory further comprises instructions causing the computer to perform:

performing synthesis optimization based on the results of the cell placement, and passing results of the synthesis optimization to the determining step.

* * * * *